United States Patent
Nakamura

(10) Patent No.: US 9,842,773 B2
(45) Date of Patent: Dec. 12, 2017

(54) SEMICONDUCTOR DEVICE AND METHOD OF MANUFACTURING THE SAME SEMICONDUCTOR DEVICE

(71) Applicant: Toshiba Memory Corporation, Minato-Ku, Tokyo (JP)

(72) Inventor: Kenro Nakamura, Kamakura Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/063,187

(22) Filed: Mar. 7, 2016

(65) Prior Publication Data
US 2016/0268163 A1 Sep. 15, 2016

(30) Foreign Application Priority Data
Mar. 13, 2015 (JP) ................ 2015-051406

(51) Int. Cl.
H01L 29/40 (2006.01)
H01L 21/768 (2006.01)
H01L 23/48 (2006.01)

(52) U.S. Cl.
CPC .. H01L 21/76898 (2013.01); H01L 21/76831 (2013.01); H01L 23/481 (2013.01); *H01L 21/76832* (2013.01)

(58) Field of Classification Search
CPC ......... H01L 21/76831; H01L 21/76832; H01L 21/76898; H01L 23/481; H01L 23/373
See application file for complete search history.

(56) References Cited

U.S. PATENT DOCUMENTS

| 8,796,136 B2 | 8/2014 | Sugiyama et al. |
| 2009/0130846 A1* | 5/2009 | Mistuhashi ......... H01L 21/6835 438/667 |
| 2013/0168832 A1* | 7/2013 | Endo ................. H01L 21/76898 257/621 |
| 2013/0181349 A1* | 7/2013 | Koyama ............... H01L 23/481 257/741 |
| 2014/0138848 A1 | 5/2014 | Matsuura |

FOREIGN PATENT DOCUMENTS

JP 2010161215 A 7/2010

* cited by examiner

*Primary Examiner* — Syed Gheyas
(74) *Attorney, Agent, or Firm* — Holtz, Holtz & Volek PC

(57) ABSTRACT

The semiconductor device includes a semiconductor layer in which a via hole penetrating an upper surface of the semiconductor layer to a lower surface of the semiconductor layer is provided. The semiconductor device includes a first insulating film provided over the lower surface of the semiconductor layer and an inner surface of the via hole. The semiconductor device includes a second insulating film provided over the lower surface of the semiconductor layer and the inner surface of the via hole with the first insulating film interposed between the second insulating film and the semiconductor layer. The semiconductor device includes a device layer including a semiconductor element and provided on the side of the upper surface of the semiconductor layer.

11 Claims, 6 Drawing Sheets ature of the present invention relates to a semiconductor device and a method of manufacturing the same semiconductor device.
SEMICONDUCTOR DEVICE AND METHOD OF MANUFACTURING THE SAME SEMICONDUCTOR DEVICE

CROSS-REFERENCE TO RELATED APPLICATION

This application is based upon and claims the benefit of priority from the prior Japanese Patent Application No. 2015-051406, filed on Mar. 13, 2015, the entire contents of which are incorporated herein by reference.

BACKGROUND

Field

An embodiment of the present invention relates to a semiconductor device and a method of manufacturing the same semiconductor device.

Background Art

Semiconductor devices have been increased in packaging density and enhanced in functionality by a wide variety of micro-machining techniques. In recent years, however, micro-machining has come close to the theoretical limit.

In view of this fact, micro-machining techniques are transitioning from two-dimensional approaches to three-dimensional approaches that form a device of a three-dimensional stack structure.

A method using the approach that relies on the three-dimensional stack is three-dimensional mounting, which involves stacking chips and bonding the chips to each other and electrically connecting the chips by wire bonding.

In another method, the chips are not electrically connected by wire bonding, but the chips are positioned with embedded electrodes thereof opposed to each other, and the electrodes are directly electrically connected to each other. According to this method, the length of the connecting wire, which would be of the order of millimeters according to the approach using wire bonding, can be reduced to the order of micrometers. As a result, the high frequency signal characteristics and the power consumption characteristics can be further substantially improved.

According to the method described above, the bonding pad region in the peripheral part of the chip is not needed, so that the chip size can be reduced compared with the chip that involves wire bonding.

As a method of forming the direct electrically connection of the embedded electrodes, formation of a through silicon via (TSV) that penetrates a device substrate having a reduced thickness has been becoming popular.

DETAILED DESCRIPTION

Figure 1:
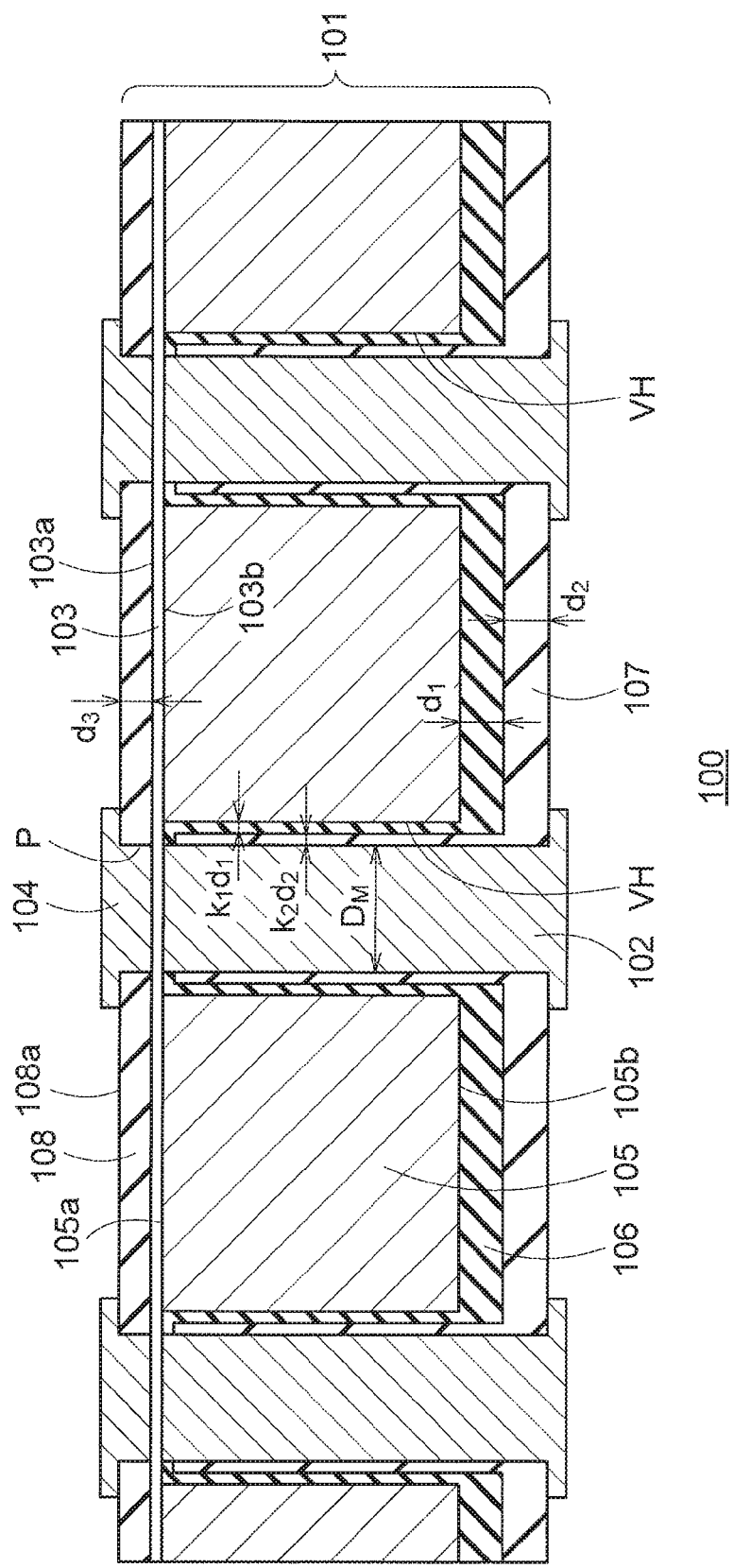
FIG. 1 is a diagram showing an example of a configuration of a semiconductor device 100 according to a first embodiment.

A semiconductor device according to an embodiment includes a semiconductor layer in which a via hole penetrating an upper surface of the semiconductor layer to a lower surface of the semiconductor layer is provided. The semiconductor device includes a first insulating film provided over the lower surface of the semiconductor layer and an inner surface of the via hole. The semiconductor device includes a second insulating film provided over the lower surface of the semiconductor layer and the inner surface of the via hole with the first insulating film interposed between the second insulating film and the semiconductor layer. The semiconductor device includes a device layer including a semiconductor element and provided on the side of the upper surface of the semiconductor layer. The semiconductor device includes a lower electrode that is provided in the via hole with the first and second insulating films interposed between the lower electrode and the inner surface of the via hole and is electrically connected to the device layer. The semiconductor device includes a protective insulating film that is provided on the upper surface of the semiconductor layer with the device layer interposed therebetween and protects the device layer. The semiconductor device includes an upper electrode that is provided to be opposed to the lower electrode with the device layer interposed therebetween and is electrically connected to the device layer.

Embodiments for Carrying Out the Invention

A major problem with the conventional method described above is occurrence of thermal stress. The thermal stress includes a thermal stress that occurs in parallel to the plane of the device substrate by the influence of the metal in the TSV and a thermal stress that occurs due to the insulating film on both sides of the device substrate and causes warpage of the device substrate.

The coefficient of linear expansion is a factor relating to thermal expansion, and the metal in the TSV has a significantly greater coefficient of linear expansion than silicon. As the temperature changes, the metal relatively significantly expands or shrinks, so that a channel of the MOS transistor expands or shrinks in the plane thereof. As a result, the performance of the MOS transistor changes.

There arises no problem if the insulting film described above symmetrically exists on both sides of the device substrate. In many cases, however, the insulating film asymmetrically exists. In such cases, the greater the difference in coefficient of linear expansion between the insulating film and silicon, the greater the warpage of the device substrate becomes. Such a warpage can inhibit wafer processing, and any warpage of separated individual chips can inhibit assembly of the chips.

The warpage of the device substrate also depends on the reduced thickness of the device substrate: the thinner the device substrate, the greater the warpage of the device substrate becomes.

For convenience of packaging, the thickness of the device substrate will tend to be smaller in future, and therefore the problem of the warpage will become more serious.

In view of such circumstances, an embodiment provides a semiconductor device that has a reduced thermal stress and thus can be prevented from being warped, and a method of manufacturing the semiconductor device.

In the following, an embodiment will be described with reference to the drawings.

First Embodiment

FIG. 1 is a diagram showing an example of a configuration of a semiconductor device 100 according to a first embodiment.

As shown in FIG. 1, the semiconductor device 100 includes a lower electrode (TSV) 102, an upper electrode 104, a device layer 103, a semiconductor layer 105, a first insulating film 106, and a second insulating film 107.

The device layer 103, the semiconductor layer 105, the first insulating film 106, the second insulating film 107 and a protective insulating film 108 form a device substrate 101. The device substrate 101 has been reduced in thickness by grinding and polishing of the rear surface thereof, and has a thickness of about 50 μm, for example.

In the semiconductor layer 105, there is provided a via hole "VH" that penetrates from an upper surface 105a to a lower surface 105b. The semiconductor layer 105 is a silicon layer.

The first insulating film 106 is provided over the lower surface 105b of the semiconductor layer 105 and an inner surface of the via hole "VH".

The first insulating film 106 has a greater thickness over the lower surface 105b of the semiconductor layer 105 than over the inner surface of the via hole "VH" in the semiconductor layer 105.

The second insulating film 107 is provided over the lower surface 105b of the semiconductor layer 105 and the inner surface of the via hole "VH" with the first insulating film 106 positioned between the second insulating film 107 and the semiconductor layer 105.

The second insulating film 107 has a greater thickness over the lower surface 105b of the semiconductor layer 105 than over the inner surface of the via hole "VH" in the semiconductor layer 105.

The first insulating film 106 and the second insulating film 107 are intended to insulate the lower electrode 102 and the silicon layer 105 from each other.

The device layer 103 is provided on the side of the upper surface 105a of the semiconductor layer 105. The device layer 103 includes a device (not shown), including a semiconductor element, such as a MOS transistor, or a wiring layer.

The lower electrode 102 is provided in the via hole "VH" with the first insulating film 106 and the second insulating film 107 interposed between the lower electrode 102 and the inner surface of the via hole "VH".

The lower electrode 102 is electrically connected to the device layer 103. For example, the lower electrode 102 is electrically connected to a semiconductor element (a gate conductive layer or the like connected to a gate of a MOS transistor) included in the device layer 103.

The lower electrode 102 has an upper part that is located in an upper part of the via hole "VH" and electrically connected to the device layer 103 and a lower part that is exposed at the bottom of the via hole "VH".

The lower electrode 102 is made of a metal (containing Cu, for example), for example.

The protective insulating film 108 is provided on the upper surface 105a of the semiconductor layer 105 with the device layer 103 interposed therebetween and protects the device layer 103.

The protective insulating film 108 contains a low thermal expansion polyimide, for example.

In the protective insulating film 108, there is formed an opening part "P" that is opposed to the lower electrode 102 with the device layer 103 interposed therebetween.

The upper electrode 104 is provided to be opposed to the lower electrode 102 with the device layer 103 interposed therebetween. In particular, the upper electrode 104 is provided in the opening part "P" to be opposed to the lower electrode 102 with the device layer 103 interposed therebetween.

The upper electrode 104 is electrically connected to the device layer 103. For example, the upper electrode 104 is electrically connected to a wiring layer (not shown) included in the device layer 103.

The upper electrode 104 has a lower part that is electrically connected to the device layer 103 and an upper part that is exposed on an upper surface 108a of the protective insulating film 108.

The upper electrode 104 is made of a metal (containing Cu, for example), for example.

A plurality of the device substrates 101 are stacked by aligning and connecting the lower electrode 102 and the upper electrode 104 with each other.

As described later, the first insulating film 106 has a smaller coefficient of linear expansion than the semiconductor layer 105.

In addition, the second insulating film 107 has a greater coefficient of linear expansion than the semiconductor layer 105.

As described later, the second insulating film 107 is a Low-k film. The Low-k film is made of organic SILK or porous silica. The porous silica contains C or H as an additive, for example.

The first insulating film 106 is a $SiO_2$ film formed by a common process, such as a CVD process.

As described later, the second insulating film 107 has a lower step coverage than the first insulating film 106.

Next, conditions for reducing expansion, shrinkage or warpage of the semiconductor device 100 configured as described above will be discussed.

In the deposition of the first insulating film 106 and the second insulating film 107, the thickness of the first and second insulating films in the via hole "VH" (on the side wall of the via hole) depends on the step coverage of the first and second insulating films. For example, suppose that the thickness of a film over the lower surface 105b of the semiconductor layer 105 is denoted by "d". Then, the thickness of a film over the side wall of the via hole can be expressed as "kd" (0<k<1).

The larger the coefficient "k", the better the step coverage becomes. In general, the chemical vapor deposition (CVD) process provides better step coverage than the sputtering process.

As described above, the first insulating film 106 and the second insulating film 107 (in other words, two layers of insulating film) are provided between the lower electrode 102 and the semiconductor layer 105.

The two-layered structure has an increased degree of freedom of thermal stress relaxation and can reduce the thermal stress on the transistor and the warpage of the chip. In the following, a reason for this will be described.

Suppose that the thicknesses of the first insulating film 106 and the second insulating film 107 over the lower surface 105b of the semiconductor layer 105 are denoted by "$d_1$" and "$d_2$", respectively, and the thickness of the protective insulating film 108 is denoted by "$d_3$". And the diameter of the lower electrode 102 is denoted by "$D_M$". The coefficients of linear expansion of the first insulating film 106, the second insulating film 107, the protective insulating film 108, the lower electrode 102 and the semiconductor layer 105 are denoted by "$x_1$", "$x_2$", "$x_3$", "$x_M$" and "$x_{Si}$", respectively. The step coverages of the first insulating film 106 and the second insulating film 107 are denoted by "$k_1$" and "$k_2$", respectively. That is, the thicknesses of the first insulating film 106 and the second insulating film 107 over the inner surface of the via hole "VH" are expressed as "$k_1 d_1$" and "$k_2 d_2$", respectively (FIG. 1).

A condition for eliminating the thermal stress on the transistor exerted in a direction parallel to the plane of the device substrate 101 is expressed by the following formula (1).

$$D_M(x_M - x_{Si}) + 2k_1 d_1(x_1 - x_{Si}) + 2k_2 d_2(x_2 - x_{Si}) = 0 \quad (1)$$

The formula (1) is a requirement that the sum of the influences of the thermal expansion with respect to that of silicon computed by taking the film thicknesses into account is zero at any temperature.

A condition for eliminating the warpage of the device substrate 101 is expressed by the following formula (2).

$$d_1(x_1 - x_{Si}) + d_2(x_2 - x_{Si}) = d_3(x_3 - x_{Si}) \quad (2)$$

The formula (2) is a requirement that the influence of the warpage of the first insulating film 106 and the second insulating film 107 in the lower part of the device substrate 101 and the influence of the warpage of the protective insulating film 108 in the upper part of the device substrate 101 are equal to each other. Note that it is assumed that the right-hand side of the formula (2) is positive, and the coefficient of linear expansion of the protective insulating film 108 is greater than the coefficient of linear expansion of silicon.

The formulas (1) and (2) can be reduced to the following formula (3) that does not include "$d_1$" and "$x_1$".

$$D_M(x_M - x_{Si}) + 2k_1 d_3(x_3 - x_{Si}) + 2(k_2 k_1)d_2(x_2 - x_{Si}) = 0 \quad (3)$$

$D_M(x_M - x_{Si}) + 2k_1 d_3(x_3 - x_{Si})$ in the left-hand side of the formula (3) is positive in almost all cases. This is because $D_M > 2d_3 > 2k_1 d_3$, and $x_M - x_{Si} > |x_3 - x_{Si}|$ in almost all cases.

Therefore, $2(k_2 - k_1)d_2(x_2 - x_{Si})$ needs to be negative, and "$d_2$" must not be zero. To meet this condition, there need to be two layers of insulating film, not a single layer of insulating film. There may be three or more layers of insulating film. In this embodiment, the plurality of insulating films stacked on one another includes both a film having a greater coefficient of linear expansion than silicon and a film having a smaller coefficient of linear expansion than silicon.

To make $2(k_2 - k_1)d_2(x_2 - x_{Si})$ negative requires that "$d_2$" is not zero, as well as $x_2 > x_{Si}$ and $k_2 < k_1$ or $x_2 < x_{Si}$ and $k_2 > k_1$.

Since $x_M > x_{Si}$ in almost all cases, if both the first insulating film 106 and the second insulating film 107 have a greater coefficient of linear expansion than silicon, the condition for eliminating the thermal stress on the transistor exerted in a direction parallel to the plane of the device substrate 101 expressed by the formula (1) is not satisfied.

In addition, if both the first insulating film 106 and the second insulating film 107 have a smaller coefficient of linear expansion than silicon, the condition for eliminating the warpage of the device substrate 101 expressed by the formula (2) is not satisfied because of the datum according to $x_3 > x_{Si}$. If $x_2 > x_{Si}$, $x_1 < x_{Si}$. If $x_2 < x_{Si}$, $x_1 > x_{Si}$. That is, one of the first insulating film 106 and the second insulating film 107 has a greater coefficient of linear expansion than silicon, and the other has a smaller coefficient of linear expansion than silicon. According to $2(k_2 - k_1)d_2(x_2 - x_{Si}) < 0$ and $d_2 > 0$, the following two cases are theoretically possible.

(a) $x_1 < x_{Si}$ and $x_2 > x_{Si}$, and $k_2 < k_1$
(b) $x_1 > x_{Si}$ and $x_2 < x_{Si}$, and $k_2 > k_1$ However, from the viewpoint of adhesion between the second insulating film 107 and the lower electrode 102, the case (a) is preferable. This is because the difference between "$x_2$" and "$x_M$" is smaller in the case (a) because $x_{Si} < x_2 < x_M$, whereas the difference between "$x_2$" and "$x_M$" is greater in the case (b) because $x_2 < x_{Si} < x_M$.

For the reason described above, the first insulating film 106 preferably has a smaller coefficient of linear expansion than silicon, and the second insulating film 107 preferably has a greater coefficient of linear expansion than silicon.

The reason why "$k_2$" < "$k_1$" in the case (a) can be explained as follows.

In the case (a), the second insulating film 107 has a greater coefficient of linear expansion than silicon, however, the second insulating film 107 provided over the lower surface 105b of the semiconductor layer 105 can balance with the protective insulating film 108 and reduce any warpage. To reduce the influence of the thermal expansion of the lower electrode 102 that occurs as a thermal stress exerted in a direction parallel to the plane of the device substrate 101, the film having a smaller coefficient of linear expansion than silicon can be used to reduce the thermal stress. That is, the first insulating film 106 having a smaller coefficient of linear expansion than silicon can reduce the thermal stress, although the second insulating film 107 provided over the side wall of the via hole does not serve to reduce the influence of the thermal expansion of the lower electrode 102. In short, the second insulating film 107 provided over the side wall of the via hole does not serve to reduce the influence of any thermal expansion of the lower electrode 102 although the second insulating film 107 provided over the lower surface 105b of the semiconductor layer 105 reduces any warpage, and therefore, the thickness "$k_2 d_2$" of the film over the inner surface of the via hole "VH" is preferably small, and $k_2 < k_1$.

Since the lower electrode 102 is made of metal, the lower electrode 102 has a significantly greater coefficient of linear expansion than silicon and therefore can more significantly thermally expand. If the insulating film surrounding the lower electrode 102 has a smaller coefficient of linear expansion than silicon, the insulating film serves to cancel the influence of the thermal expansion with respect to the silicon.

Next, a specific condition that satisfies the formula (3) described above will be described.

First, it is assumed that the lower electrode 102 is made of Cu. That is, the coefficient "$x_M$" of linear expansion of the lower electrode 102 is 17 ppm/K. The coefficient "$x_{Si}$" of linear expansion of silicon is 3 ppm/K. It is also assumed that the diameter "$D_M$" of the lower electrode 102 is 10 μm.

Next, conditions concerning the first insulating film 106 will be described. For example, it is assumed that the first insulating film 106 is a $SiO_2$ film deposited by the CVD process. The $SiO_2$ film deposited by the CVD process has a good step coverage, and "$k_1$" is 0.9, for example.

Next, conditions concerning the protective insulating film 108 will be described. IL is assumed that the protective insulating film 108 is made of a low thermal expansion polyimide. The coefficient "$x_3$" of linear expansion of the low thermal expansion polyimide is 5 ppm/K. It is assumed that the thickness "$d_3$" of the film is 5 μm.

Substituting these values into the formula (3) results in the following formula (4) concerning the second insulating film 107.

$$79+(k_2-0.9)d_2(x_2-3)=0 \quad (4)$$

Since $k_2<k_1$ as described above, is determined within a range of $0<k_2<0.9$.

For example, practical solutions are as follows: $k_2=0.1$, $d_2=2$ μm, and $x_2=52$ ppm/K. 52 ppm/K as the coefficient of linear expansion of the second insulating film 107 is significantly great. This value can reasonably be achieved by organic SILK or porous silica containing C or H as an additive, which forms a kind of Low-k film. Such a Low-k film is deposited by spin coating. Therefore, the Low-k film has low step coverage, which is not contradictory to the small value of $k_2=0.1$.

As described above, the thermal stress in the semiconductor device 100 is reduced to prevent expansion, shrinkage and warpage of the semiconductor device 100 by selecting the materials of the components of the semiconductor device 100 on which TSV is provided and adjusting the coefficient of linear expansion, the thickness and the step coverage of the components so as to satisfy the formulas (1) to (4) described above.

Next, an example of a method of manufacturing the semiconductor device 100 configured as described above will be described. FIGS. 2 to 6 are diagrams for illustrating steps of the method of manufacturing the first semiconductor device 100.

Figure 2:
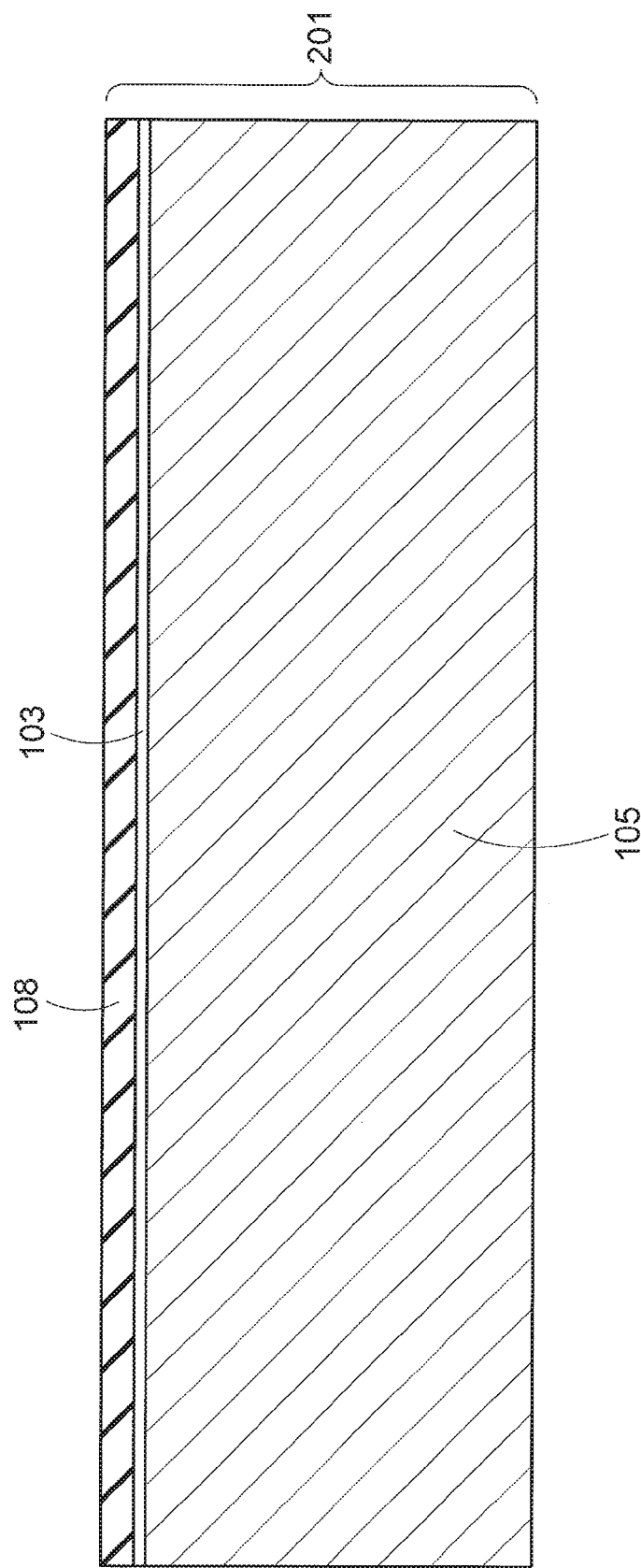
FIG. 2 is a diagram for illustrating a step of the method of manufacturing the first semiconductor device 100.

First, the device layer 103 including a semiconductor element is formed on the semiconductor layer 105. The protective insulating film 108 is then formed on the device layer 103 (FIG. 2).

Figure 3:
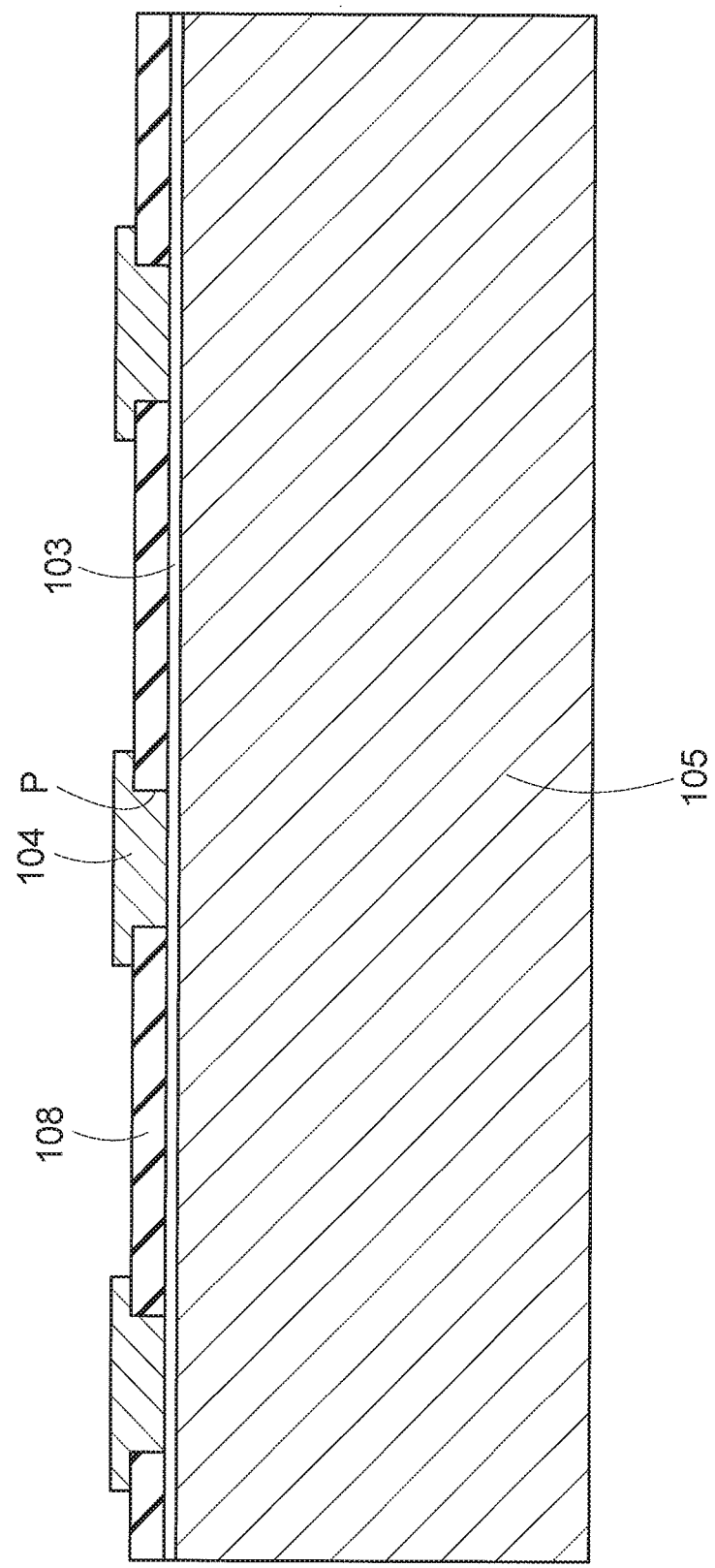
FIG. 3 is a diagram for illustrating a step of the method of manufacturing the first semiconductor device 100 and is continuous with FIG. 2.

The opening part "P" is then formed in the protective insulating film 108. The upper electrode 104 is then formed on the device layer 103 in the opening part "P" of the protective insulating film 108 (FIG. 3). The upper electrode 104 is formed by burying a metal (Cu, for example) in the opening part "P" by a plating process, for example.

The lower surface 105b of the semiconductor layer 105 is then shaved (ground or polished) to reduce the thickness of the semiconductor layer 105. The grinding or polishing is performed with the substrate including the semiconductor layer 105 being supported on a supporting substrate.

Figure 4:
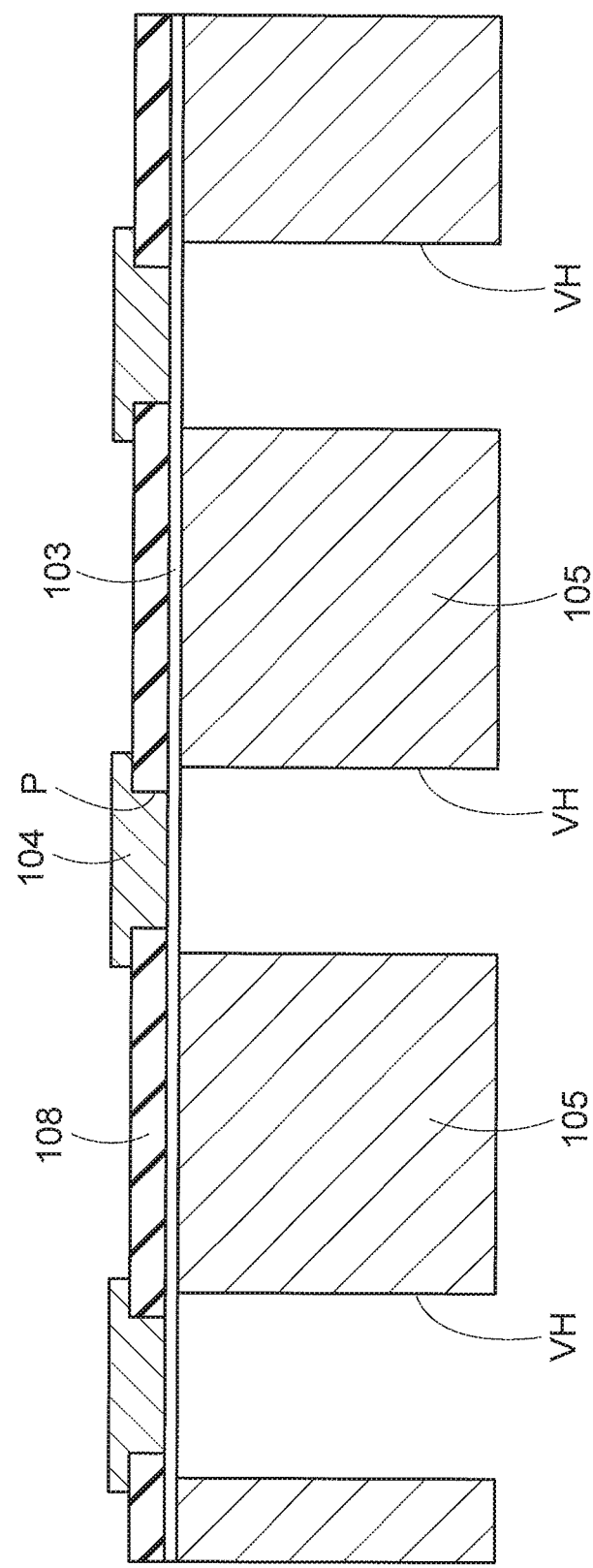
FIG. 4 is a diagram for illustrating a step of the method of manufacturing the first semiconductor device 100 and is continuous with FIG. 3.

The via hole "VH" that penetrates the semiconductor layer 105 from the upper surface to the lower surface 105b is then formed to expose the lower surface 103b of the device layer 103 (FIG. 4). The via hole "VH" is formed in the semiconductor layer 105 by a photolithography process and a RIE process, for example.

Figure 5:
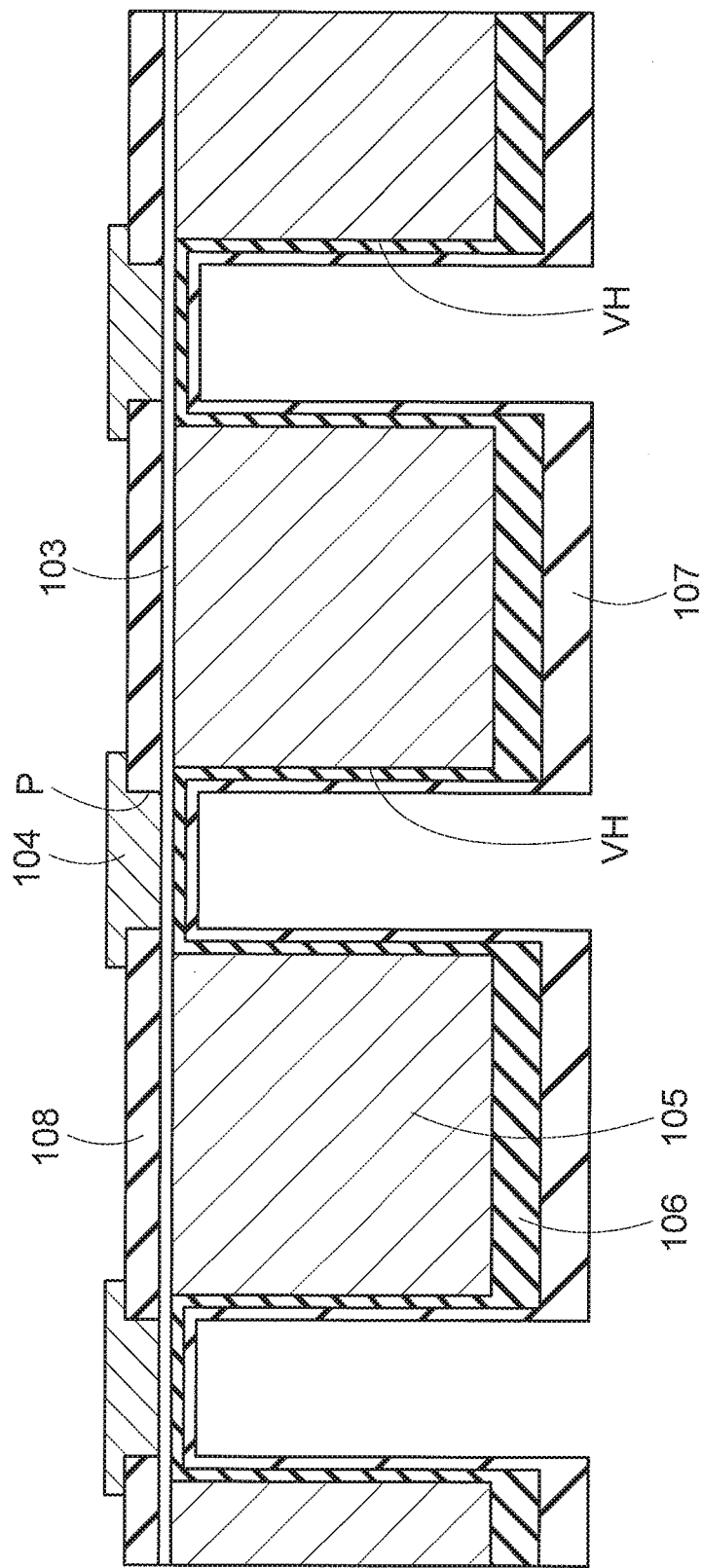
FIG. 5 is a diagram for illustrating a step of the method of manufacturing the first semiconductor device 100 and is continuous with FIG. 4.

The first insulating film 106 is then formed over the lower surface 105b of the semiconductor layer 105 and the inner surface of the via hole "VH". After that, the second insulating film 107 is formed over the lower surface 105b of the semiconductor layer 105 and the inner surface of the via hole "VH" with the first insulating film 106 being interposed between the second insulating film 107 and the semiconductor layer 105 (FIG. 5).

The first insulating film 106 is first deposited and the second insulating film 107 is then deposited by the CVD process or the sputtering process.

The adhesion between the first insulating film and the second insulating film is typically low, because the films have significantly different coefficients of linear expansion. To overcome this drawback, an early phase of the deposition of the second insulating film is preferably improved. The second insulating film is a kind of Low-k film and has physical properties different from those of the common $SiO_2$ film. The difference in physical properties can be controlled by adjusting the deposition conditions, and a deposition condition that provides less different physical properties can be adopted for the early phase of the deposition of the second insulating film.

Figure 6:
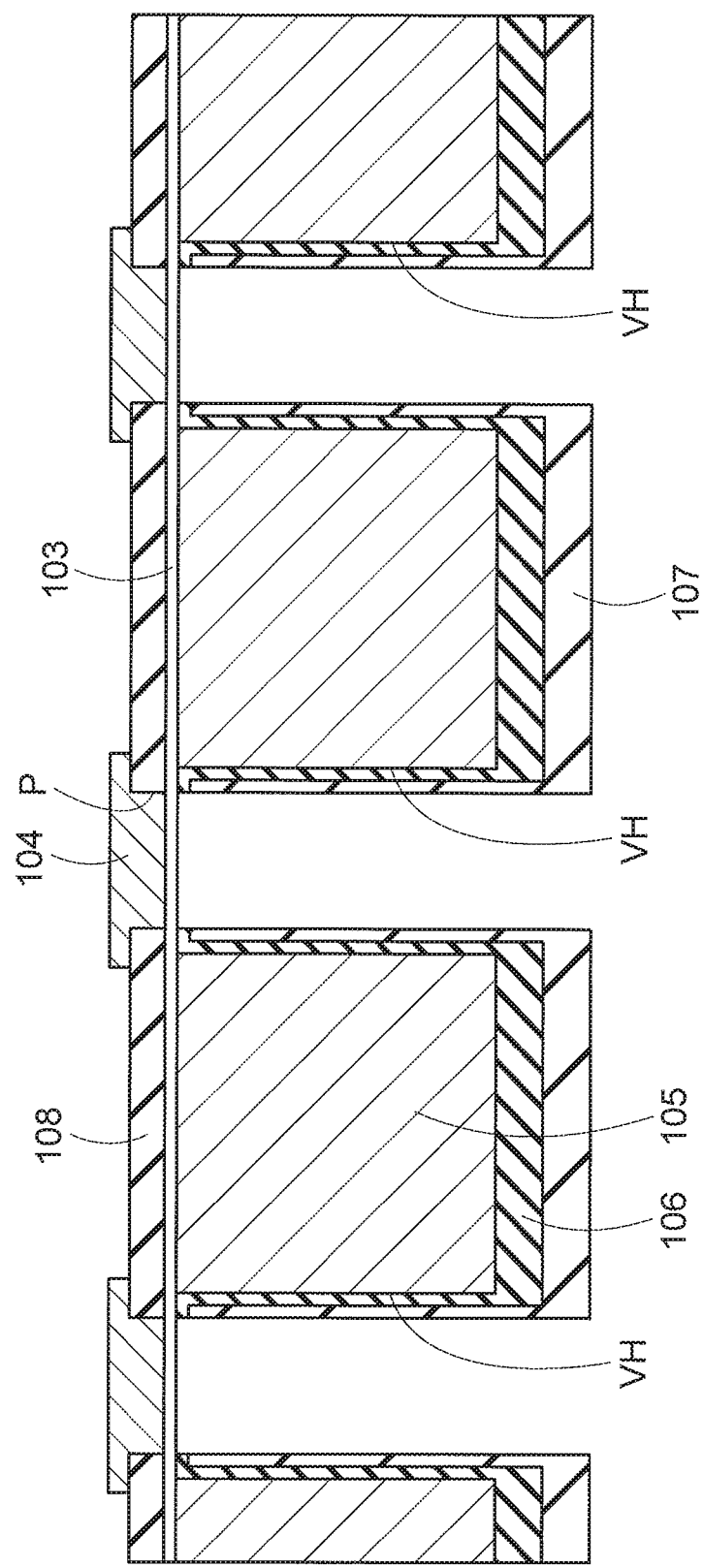
FIG. 6 is a diagram for illustrating a step of the method of manufacturing the first semiconductor device 100 and is continuous with FIG. 5.

The first insulating film 106 and the second insulating film 107 over the lower surface 103b of the device layer 103 in the via hole "VH" are selectively removed (FIG. 6).

For example, the first insulating film 106 and the second insulating film 107 that exist on the bottom of the via hole "VH" (the lower surface of the device layer 103) are removed by entire-surface etch back in a reactive ion etching (RIE) process. In this step, the thickness of the second insulating film 107 on the region without the inside of the via hole "VH" decreases in an amount corresponding to the etch back.

The lower electrode 102 electrically connected to the device layer 103 is formed in the via hole "VH" with the first insulating film 106 and the second insulating film 107 interposed between the lower electrode 102 and the inner surface of the via hole "VH". For example, the lower electrode 102 is formed by burying a metal in the via hole "VH" by the plating process.

In this way, the semiconductor device 100 shown in FIG. 1 is completed.

As described above, the semiconductor device according to the first embodiment can reduce the thermal stress and the expansion, shrinkage and warpage of the device substrate.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device, comprising: a semiconductor layer in which a via hole penetrating an upper surface of the semiconductor layer to a lower surface of the semiconductor layer is provided;
   a first insulating film provided over the lower surface of the semiconductor layer and an inner surface of the via hole;
   a second insulating film provided over the lower surface of the semiconductor layer and the inner surface of the via hole with the first insulating film interposed between the second insulating film and the semiconductor layer;
   a device layer including a semiconductor element and provided on a side of the upper surface of the semiconductor layer;
   a lower electrode that is provided in the via hole with the first and second insulating films interposed between the lower electrode and the inner surface of the via hole and is electrically connected to the device layer;
   a protective insulating film that is provided on the upper surface of the semiconductor layer with the device layer interposed therebetween and protects the device layer; and an upper electrode that is provided to be opposed to the lower electrode with the device layer interposed therebetween and is electrically connected to the device layer, wherein the first insulating film has a greater thickness over the lower surface of the semiconductor layer than over the inner surface of the via hole in the semiconductor layer, wherein the second insulating film has a greater thickness over the lower surface of the semiconductor layer than over the inner surface of the via hole in the semiconductor layer, and wherein a step coverage of the first insulating film and a step coverage of the second insulating film are not equal to each other.

2. The semiconductor device according to claim 1, wherein one of the first insulating film and the second insulating film has a greater coefficient of linear expansion than the semiconductor layer, and another of the first insulating film and the second insulating film has a smaller coefficient of linear expansion than the semiconductor layer.

3. The semiconductor device according to claim 2, wherein the first insulating film has a smaller coefficient of linear expansion than the semiconductor layer, and the second insulating film has a greater coefficient of linear expansion than the semiconductor layer.

4. The semiconductor device according to claim 2, wherein the one of the first insulating film and the second insulating film that has a greater coefficient of linear expansion than the semiconductor layer is a Low-k film.

5. The semiconductor device according to claim 3, wherein the second insulating film that has a greater coefficient of linear expansion than the semiconductor layer is a Low-k film.

6. The semiconductor device according to claim 1, wherein the semiconductor layer is a silicon layer.

7. The semiconductor device according to claim 2, wherein the semiconductor layer is a silicon layer.

8. The semiconductor device according to claim 3, wherein the semiconductor layer is a silicon layer.

9. The semiconductor device according to claim 2, wherein the one of the first insulating film and the second insulating film that has a greater coefficient of linear expansion than the semiconductor layer has a lower step coverage than the another of the first insulating film and the second insulating film.

10. The semiconductor device according to claim 7, wherein the one of the first insulating film and the second insulating film that has a greater coefficient of linear expansion than the semiconductor layer has a lower step coverage than the another of the first insulating film and the second insulating film.

11. The semiconductor device according to claim 1, wherein the first insulating film and the second insulating film extend integrally from a side wall of the via hole to the lower surface of the semiconductor layer.

* * * * *